United States Patent
Yueh et al.

(10) Patent No.: US 12,245,494 B2
(45) Date of Patent: *Mar. 4, 2025

(54) ELECTRONIC DEVICE

(71) Applicant: Innolux Corporation, Miaoli County (TW)

(72) Inventors: Jui-Jen Yueh, Miaoli County (TW); Tsung-Han Tsai, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/515,182

(22) Filed: Nov. 20, 2023

(65) Prior Publication Data

US 2024/0090307 A1  Mar. 14, 2024

Related U.S. Application Data

(63) Continuation of application No. 17/412,264, filed on Aug. 26, 2021, now Pat. No. 11,864,456.

(30) Foreign Application Priority Data

Sep. 24, 2020 (CN) .......................... 202011015975.3

(51) Int. Cl.
*H10K 77/10* (2023.01)

(52) U.S. Cl.
CPC .................................. *H10K 77/111* (2023.02)

(58) Field of Classification Search
CPC .. H10K 77/111; H10K 59/131; Y02E 10/549; G09F 9/301; H05K 1/028
See application file for complete search history.

(56) References Cited

U.S. PATENT DOCUMENTS 11,864,456 B2 * 1/2024 Yueh .................... H10K 77/111

FOREIGN PATENT DOCUMENTS

CN  108511487  9/2018

* cited by examiner

*Primary Examiner* — Joe E. Schoenholtz
(74) *Attorney, Agent, or Firm* — JCIPRNET

(57) ABSTRACT

An electronic device has a first substrate having a hole. A circuit is disposed on the first substrate. A conductive element is disposed in the hole of the first substrate. A second substrate is corresponded to the first substrate, the second substrate has an opening which penetrates the second substrate and corresponds to the conductive element. An electronic component is corresponded to the second substrate, and the electronic component is electrically connected to the circuit and the conductive element.

6 Claims, 8 Drawing Sheets

ELECTRONIC DEVICE

CROSS-REFERENCE TO RELATED APPLICATION

This application is a continuation application of and claims the priority benefit of a prior U.S. application Ser. No. 17/412,264, filed on Aug. 26, 2021. The prior U.S. application Ser. No. 17/412,264 claims the priority benefit of China application serial no. 202011015975.3, filed on Sep. 24, 2020. The entirety of each of the above-mentioned patent applications is hereby incorporated by reference herein and made a part of this specification.

BACKGROUND

Technical Field

This disclosure relates to a method for manufacturing an electronic device.

Description of Related Art

The functions and scope of application of electronic devices have become more extensive, and various electronic device production technologies have also emerged accordingly. The technology of using a flexible substrate to produce an electronic device is one of such technologies. In recent years, the industry has continuously improved on the issues faced by the usage of flexible substrates in the production of electronic devices, so as to produce better electronic devices.

SUMMARY

This disclosure provides a method for manufacturing an electronic device, which facilitates a reduction in the thickness and the volume of the electronic device.

According to an embodiment of the disclosure, a method for manufacturing an electronic device includes the following steps. A flexible substrate is provided, in which the flexible substrate has two surfaces opposite to each other. A circuit is formed on one of the surfaces of the flexible substrate. A through hole is formed in the flexible substrate. A conductive bridge is formed in the through hole. A supporting substrate is attached to the other surface of the flexible substrate. An opening penetrating the supporting substrate is formed, and the opening corresponds to the through hole in the flexible substrate. An electronic component is mounted on the supporting substrate, and the electronic component is allowed to be electrically connected to the circuit through the conductive bridge.

In summary, the method for manufacturing the electronic device according to the embodiment of the disclosure can allow an electrical signal of the electronic device to be transmitted between the two surfaces of the flexible substrate, thereby realizing a thinner electronic device.

To make the above-mentioned features and advantages of the disclosure more comprehensible, several embodiments accompanied by drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and together with the description, serve to explain the principle of the disclosure.

DESCRIPTION OF THE EMBODIMENTS

Figure 1:
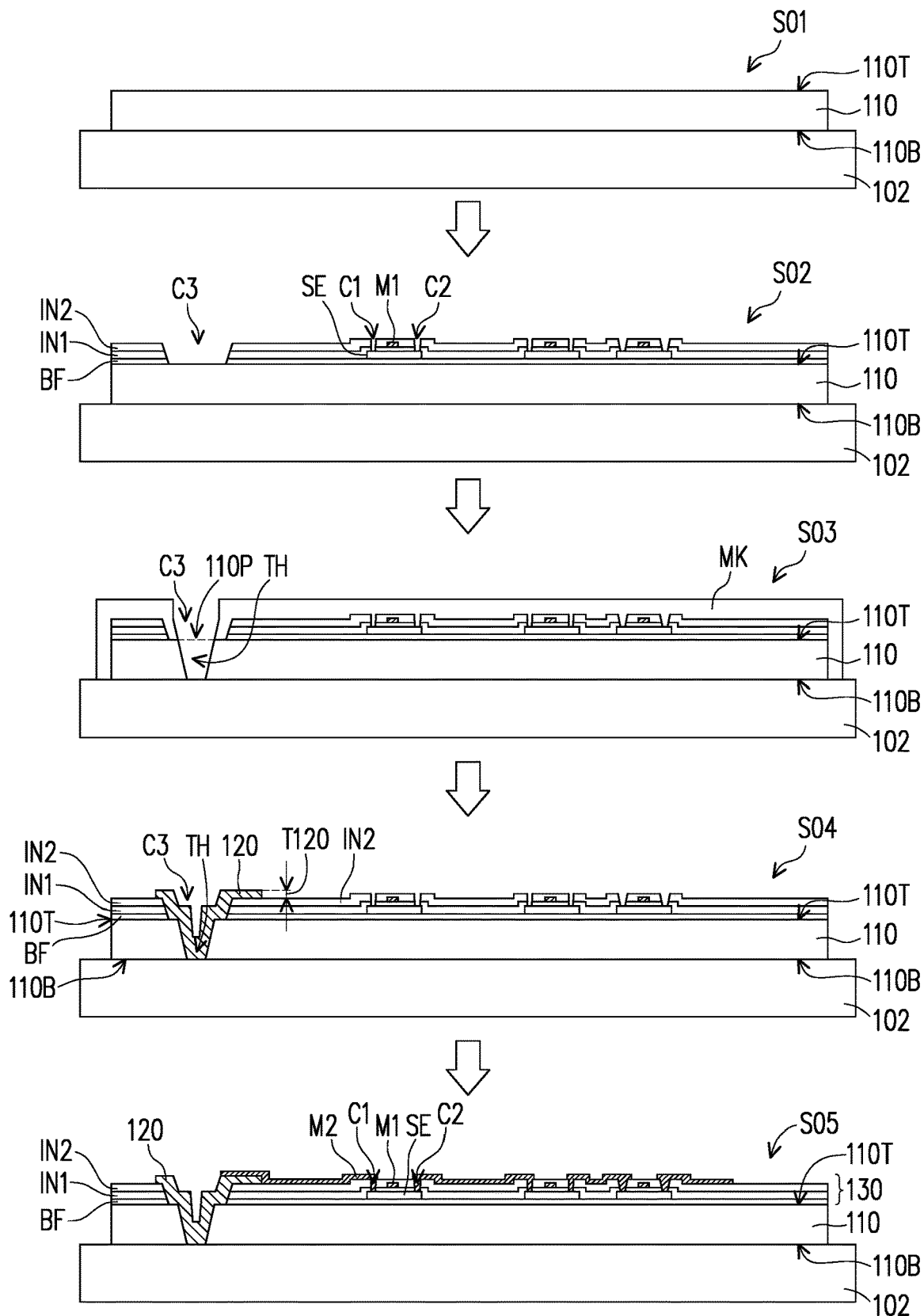
FIG. 1 is a schematic cross-sectional view of a part of a process of a method for manufacturing an electronic device according to an embodiment of the disclosure.

Reference will now be made in detail to the exemplary embodiments of the disclosure, examples of which are illustrated in the drawings. Whenever possible, the same reference numerals are used in the drawings and descriptions to represent the same or similar parts.

When a structure (layer, component, or substrate) described in the disclosure is located on/above another structure (layer, component, or substrate), it may indicate that the two structures are adjacent and directly connected, or it may also indicate that the two structures are adjacent and indirectly connected. Being indirectly connected indicates that there is at least one intermediary structure (intermediary layer, intermediary component, intermediary substrate, or intermediary spacing) between the two structures, in which the lower surface of one structure is adjacent or directly connected to the upper surface of the intermediary structure, and the upper surface of the other structure is adjacent or directly connected to the lower surface of the intermediary structure, and the intermediary structure may be composed of a single-layer or a multi-layer physical structure or non-physical structure, without any limitation. In the disclosure, when a structure is disposed "on" another structure, it may indicate that the structure is "directly" on the other structure, or that the structure is "indirectly" on the other structure, that is, at least one structure is sandwiched between the structure and the other structure.

The terms "electrically connected" or "coupled" described in the disclosure may indicate being directly connected or indirectly connected. In the case of being directly connected, the end points of elements on two circuits are directly connected or connected to each other by a conductor wire segment. In the case of being indirectly connected, there is an element such as a switch, a diode, a capacitor, an inductor, a resistor, other suitable elements, or a combination of the above elements between the end points of the elements on the two circuits, but not limited thereto.

In the disclosure, the thickness, length, and width may be measured by an optical microscope, while the thickness may be measured from a cross-sectional image of an electron microscope, but not limited thereto. In addition, any two values or directions for comparison may have certain errors. Furthermore, the terms "approximately", "equal to", "equivalent", "same", "substantially" or "roughly" mentioned in the disclosure usually implies within 15% of a given value or range, or it implies falling within 5%, 3%, 2%, 1% or 0.5% of a given value or range. Moreover, phrases such as "a given range is a first numerical value to a second numerical value", "a given range falls within a range of a first numerical value to a second numerical value" represent that a given range includes a first numerical value, a second numerical value, and values in between them.

It should be noted that in the following embodiments, the features in several different embodiments may be replaced, recombined, and mixed to form other embodiments without departing from the spirit of the disclosure. As long as the features between the embodiments do not violate the spirit of the disclosure or are not in conflict with each other, they may be mixed and used arbitrarily.

Figure 2:
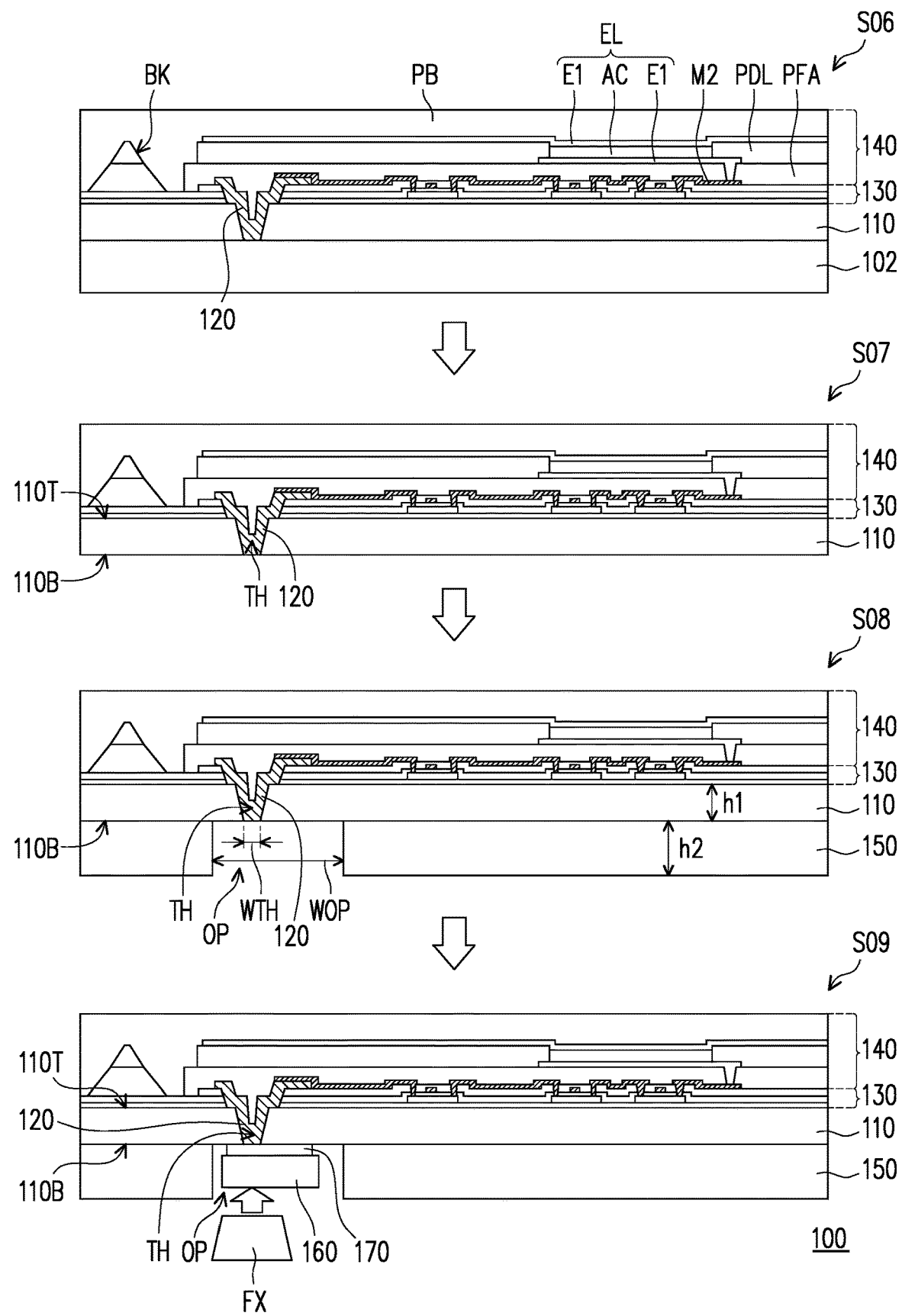
FIG. 2 is a schematic cross-sectional view of the other part of the process of the method for manufacturing the electronic device according to an embodiment of the disclosure.

FIGS. 1 and 2 are schematic cross-sectional views of a process of a method for manufacturing an electronic device according to an embodiment of the disclosure. With reference to FIG. 1, as shown in Step S01, a flexible substrate 110 is formed on a carrier board 102. The carrier board 102 may be a board that is supportive and can reduce bending, wrinkling and/or deformation of the flexible substrate 110. For example, the material of the carrier board 102 may include glass, quartz or other suitable materials, or a combination of the above materials, but the disclosure is not limited thereto. The flexible substrate 110 may be formed by curing an initial material in a liquid and/or gel-like state. In some embodiments, a method for forming the flexible substrate 110 includes coating the initial material in the liquid and/or gel-like state on the carrier board 102, and then curing the initial material in the liquid and/or gel-like state using a curing process to form the flexible substrate 110. The curing process that may be used includes thermal curing, light curing, or a combination of the above curing processes, but the disclosure is not limited thereto. The flexible substrate 110 may include a single layer structure composed of material such as polyimide (PI), polyethylene terephthalate (PET), or one of other applicable materials, or a stack or mixture of at least two of the above materials, but is not limited thereto. In other words, the flexible substrate 110 may be a single-layer substrate or a multi-layer substrate formed by stacking multiple layers together. In some embodiments, a release layer may be disposed between the flexible substrate 110 and the carrier board 102 to enable a smooth separation of the flexible substrate 110 from the carrier board 102.

Next, as shown in Step S02, a buffer layer BF, a semiconductor layer SE, an insulation layer IN1, a metal layer M1, and an insulation layer IN2 are sequentially formed on the flexible substrate 110. The buffer layer BF is in direct contact with the flexible substrate 110, the semiconductor layer SE is formed on the buffer layer BF, the insulation layer IN1 covers the semiconductor layer SE, the metal layer M1 is formed on the insulation layer IN1 to allow the insulation layer IN1 to separate the semiconductor layer SE from the metal layer M1, and the insulation layer IN2 covers the metal layer M1. The materials of the buffer layer BF, the insulation layer IN1 and the insulation layer IN2 are all insulating materials, such as silicon oxide, silicon nitride, or silicon oxynitride, but the disclosure is not limited thereto. The buffer layer BF may be configured to increase fixation between the semiconductor layer SE and the flexible substrate 110, or to reduce the probability of ions diffusing into the semiconductor layer SE, but in some embodiments, the buffer layer BF may be omitted.

The semiconductor layer SE may be patterned and distributed in a designated region. The material of the semiconductor layer SE includes amorphous silicon, polycrystalline silicon, microcrystalline silicon, organic semiconductor materials, oxide semiconductor materials, etc., but the disclosure is not limited thereto. The metal layer M1 is then patterned so that at least a part is disposed corresponding to the semiconductor layer SE. For example, an orthographic projection of the pattern of the metal layer M1 on the flexible substrate 110 may overlap an orthographic projection of the pattern of the semiconductor layer SE on the flexible substrate 110. However, the insulation layer IN1 is sandwiched between the metal layer M1 and the semiconductor SE to prevent the two layers from being in direct electrical contact with each other.

In the embodiment, after the insulation layer IN2 is produced, contact holes C1 and C2 may be formed. The contact hole C1 and the contact hole C2 are disposed at positions roughly corresponding to the semiconductor layer SE and located on both sides of the metal layer M1. The contact hole C1 and the contact hole C2 may extend to the semiconductor layer SE to expose a part of the semiconductor layer SE. In addition, a pre-through hole C3 may be formed concurrently as the contact holes C1 and C2 are being produced. The pre-through hole C3 is disposed at a position roughly in a region where neither the semiconductor layer SE nor the metal layer M1 is present, and the pre-through hole C3 may penetrate the insulation layer IN2, the insulation layer IN1, and the buffer layer BF. In this way, the pre-through hole C3 may expose the flexible substrate 110.

After that, as shown in Step S03, a mask layer MK is formed on the carrier board 102, and the flexible substrate 110 is patterned by the mask layer MK to form a through hole TH that penetrates the flexible substrate 110 in the flexible substrate 110. In the embodiment, the flexible substrate 110 exposed by the pre-through hole C3 may be partially shielded and partially exposed by the mask layer MK. For example, a part 110P of the flexible substrate 110 is not shielded by the mask layer MK. Therefore, after the mask layer MK is formed, the part 110P of the flexible substrate 110 may be removed by an etching process to form the through hole TH. The through hole TH may penetrate the flexible substrate 110 so that a partial region of the carrier board 102 is exposed in the through hole TH. After the through hole TH is formed, the mask layer MK may be removed.

Next, as shown in Step S04, a conductive bridge 120 is formed in the through hole TH. The through hole TH and the pre-through hole C3 are communicated to each other, and the conductive bridge 120 may continuously cover a side wall of the through hole TH and a side wall of the pre-through hole C3 and be in contact with the partial region of the carrier board 102 exposed by the through hole TH. Specifically, the conductive bridge 120 may be formed from a top surface of the insulating layer IN2, conforming to the sidewall of the pre-through hole C3 and being in contact with the insulating layer IN2, the insulating layer IN1, and the buffer layer BF, and being in contact with the flexible substrate 110 by conforming to the sidewall of the through hole TH, and then being in contact with the partial region of the carrier 102 exposed by the through hole TH. In this way, the flexible substrate 110 includes a top surface 110T and a bottom surface 110B opposite to each other, and may form a conductive path through the conductive bridge 120. The conductive bridge 120 may be produced by a thin film deposition process in combination with a lithography process, or may be produced by a printing process. In addition, a thickness T120 of the conductive bridge 120 may, for example, be adjusted according to design requirements. In some embodiments, the thickness T120 of the conductive bridge 120 may be greater than 1 micrometer, but is not limited thereto.

Next, as shown in Step S05, a metal layer M2 is formed on the insulation layer IN2, and the metal layer M2 may be patterned to realize a required electrical connection relationship. For example, a part of the metal layer M2 may be formed in the contact hole C1 to be in contact with a part of the semiconductor layer SE, and a part may be formed in the contact hole C2 to be in contact with another part of the semiconductor layer SE. In addition, a part of the metal layer M2 may extend to the conductive bridge 120 and be in contact with the conductive bridge 120, thereby forming a required circuit 130. In an embodiment not shown, the metal layer M2 may also have a part connected to the metal layer M1. In this way, the conductive bridge 120 may be electrically connected to the corresponding metal layer M2, and/or electrically connected to the corresponding metal layer M1 through the metal layer M2. However, the structure of the circuit 130 shown in the Step S05 is for illustrative purpose only, and is not intended to limit the disclosure. In addition, the Step S02, the Step S03, and the Step S05 may be regarded as specific steps for forming the circuit 130 on the top surface 110T of the flexible substrate 110, but the disclosure is not limited thereto. In other embodiments, steps for forming the circuit 130 on the flexible substrate 110 may include other steps, or omit a part of the above steps. In the embodiment, the circuit 130 is formed after the through hole TH is formed, but the disclosure is not limited thereto. In other embodiments, the circuit 130 may be formed before the through hole TH is formed. For example, the Step S03 may be executed after the Step S05.

With reference to FIG. 2, Step S06 represents a method for forming an element layer 140 on the circuit 130. The element layer 140 may include a flat layer PFA, a pixel definition layer PDL, a light-emitting element EL, a block wall structure BK, and a packaging layer PB. The flat layer PFA covers the circuit 130 and reduces unevenness due to a concave-convex structure of the circuit 130. The pixel definition layer PDL is disposed on the flat layer PFA and defines a pixel region. The light-emitting element EL is disposed in the pixel region defined by the pixel definition layer PDL, and includes a light-emitting function layer AC, a first electrode E1 and a second electrode E2. The first electrode E1 is configured on the flat layer PFA and electrically connected to the metal layer M2 in the circuit 130, the light-emitting function layer AC is configured on the first electrode E1, and the second electrode E2 is configured on the light-emitting function layer AC. The light-emitting functional layer AC may be a single-layer structure or a multi-layer structure, such as an emission layer, a hole transport layer, and an electron transport layer, but the disclosure is not limited thereto. The material of the light-emitting function layer AC is, for example, an organic light-emitting material, but the disclosure is not limited thereto. Here, the light-emitting element EL is illustrated using an organic light-emitting element as an example. In some embodiments, the light-emitting element EL may include, for example, an organic light-emitting diode (OLED), a mini LED, a micro LED, a quantum dot (QD) LED such as QLED, QDLED, fluorescence, phosphor or other suitable materials, and the materials may be in any arrangement or combination, but is not limited thereto. The block wall structure BK is disposed surrounding the flexible substrate 110, and the block wall structure BK may include a multi-layer structure, such as a two-layer structure, in which one of the layers may be a same layer as the flat layer PFA, while the other layer may be a same layer as the pixel definition layer PDL, but the disclosure is not limited thereto, and the block wall structure BK may also be a single-layer structure. In addition, the packaging layer PB may cover the entire surface of the flexible substrate 110 to increase the effectiveness of its role as a water and oxygen barrier.

Next, as shown in Step S07, the carrier board 102 is removed to expose the bottom surface 110B of the flexible substrate 110. At this time, the conductive bridge 120 located in the through hole TH of the flexible substrate 110 will also be exposed at the bottom surface 110B. In some embodiments, a method for removing the carrier board 102 may include laser stripping, mechanical stripping, or other processes that may separate the carrier board 102 from the flexible substrate 110. In addition, before stripping off the carrier board 102, the flexible substrate 110 may be temporarily placed on an intermediate carrier board (not shown) in an upside-down manner, so that the stripping process may be performed after the carrier board 102 is exposed. In this way, after the carrier board 102 is stripped off, the flexible substrate 110, and the circuit 130 and the element layer 140 on the flexible substrate 110 may be temporarily carried by the intermediate carrier board, so that damage or deformation can be prevented.

Subsequently, as shown in Step S08, a supporting substrate 150 is attached onto the flexible substrate 110. The mechanical strength of the supporting substrate 150 may be greater than the mechanical strength of the flexible substrate 110. Therefore, the supporting substrate 150 can prevent the flexible substrate 110 from being deformed, thereby preventing deformation or damage to the circuit 130 and the element layer 140. In general, a thickness h1 of the flexible substrate 110 may be smaller than a thickness h2 of the supporting substrate 150, but the disclosure is not limited thereto. In some embodiments, the supporting substrate 150 may also be flexible. For example, the supporting substrate 150 may be a substrate that may be bent and restored to its original state after bending. The material of the supporting substrate 150 includes polyethylene terephthalate, polycarbonate, acrylic, etc., but is not limited thereto. In other embodiments, the supporting substrate 150 may be inflexible, and its material includes glass, quartz, etc., but is not limited thereto. In other embodiments, the Step S07 may be omitted and the carrier board 102 may be directly used as the supporting substrate 150.

In addition, the Step S08 also includes forming an opening OP in the supporting substrate 150. In some embodiments, the opening OP may be formed by a laser cutting process. However, the opening OP may also be formed by a die cutting process. The opening OP penetrates the supporting substrate 150, and the opening OP corresponds to the through hole TH in the flexible substrate 110. In this way, the conductive bridge 120 in the through hole TH may be exposed by the opening OP. Here, a width WOP of the opening OP, for example, in a cross-sectional view in a direction, may be greater than a width WTH of the through hole TH at the bottom surface 110B of the flexible substrate 110. Therefore, the opening OP can expose the conductive bridge 120 in the supporting substrate 150 for subsequent processing.

Next, Step S09 is a process in which an electronic component 160 is mounted on the supporting substrate 150 and electrically connected to the conductive bridge 120. The process includes mounting the electronic component 160 on any surface of the supporting substrate 150, for example, mounting the electronic component 160 in the opening OP or at a side surface of the supporting substrate 150 or at a bottom surface of the supporting substrate 150 so as to allow the electronic component 160 to be electrically connected to the circuit 130 on the flexible substrate 110 through the conductive bridge 120 to form the electronic device 100. As shown in FIG. 2, the electronic component 160 may be disposed in the opening OP of the supporting substrate 150, and the electronic component 160 may be, for example, joined to the conductive bridge 120 exposed by the opening OP through a joint 170. The joint 170 may include conductive glue, solder, metal bumps, etc., so that the electronic component 160 is electrically connected to the conductive bridge 120 in the through hole TH. In addition, an attachment tool FX may be used to mount the electronic component 160 onto the flexible substrate 110 in the Step S09, but the disclosure is not limited thereto.

As shown in the Step S09 of FIG. 2, the electronic device 100 includes the flexible substrate 110 having the through hole TH, the conductive bridge 120 disposed in the through hole TH, the circuit 130 electrically connected to the conductive bridge 120, the element layer 140 connected to the circuit 130, the supporting substrate 150 that supports the flexible substrate 110 and has the opening OP, and the electronic component 160 that is at least partially disposed in the opening OP and electrically connected to the conductive bridge 120. The through hole TH penetrates the flexible substrate 110, enabling the conductive bridge 120 to electrically connect the circuit 130 located on the top surface 110T of the flexible substrate 110 to the electronic component 160 located below the bottom surface 110B of the flexible substrate 110. Such a design can realize an electrical connection between components on the two opposite surfaces of the flexible substrate 110 without increasing its thickness, so that the thickness of the electronic device 100 is reduced and its volume is more compact. In FIG. 2, the electronic component 160 is mounted on the supporting substrate 150 and electrically connected to the conductive bridge 120. The electronic component 160 may be a packaged integrated circuit and the electronic component 160 is directly disposed in the opening OP of the supporting substrate 150, but the disclosure is not limited thereto.

Figure 3:
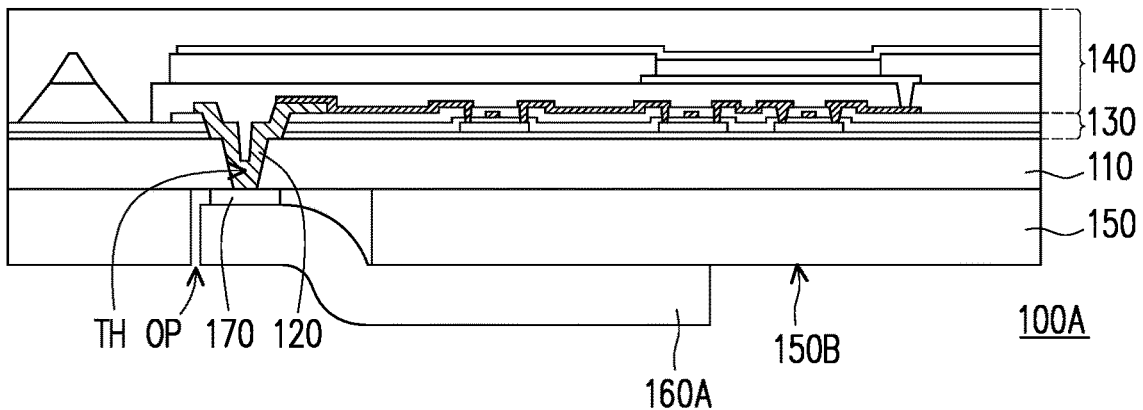
FIG. 3 is a schematic cross-sectional view of an electronic device according to another embodiment of the disclosure.

FIG. 3 is a schematic cross-sectional view of an electronic device according to another embodiment of the disclosure. As shown in FIG. 3, an electronic device 100A, similar to the electronic device 100, may be produced using the manufacturing method including the above Step S01 to the Step S09. The electronic device 100A includes the flexible substrate 110 having the through hole TH, the conductive bridge 120 disposed in the through hole TH, the circuit 130 electrically connected to the conductive bridge 120, the element layer 140 connected to the circuit 130, the supporting substrate 150 that supports the flexible substrate 110 and has the opening OP, and an electronic component 160A mounted on the supporting substrate 150 and electrically connected to the conductive bridge 120. The electronic component 160A may be a printed circuit board and the electronic component 160A may be joined to the conductive bridge 120 exposed by the opening OP through the joint 170. The electronic component 160A may be partially disposed in the opening OP of the supporting substrate 150 and partially extended to the bottom surface 150B of the supporting substrate 150.

Figure 4:
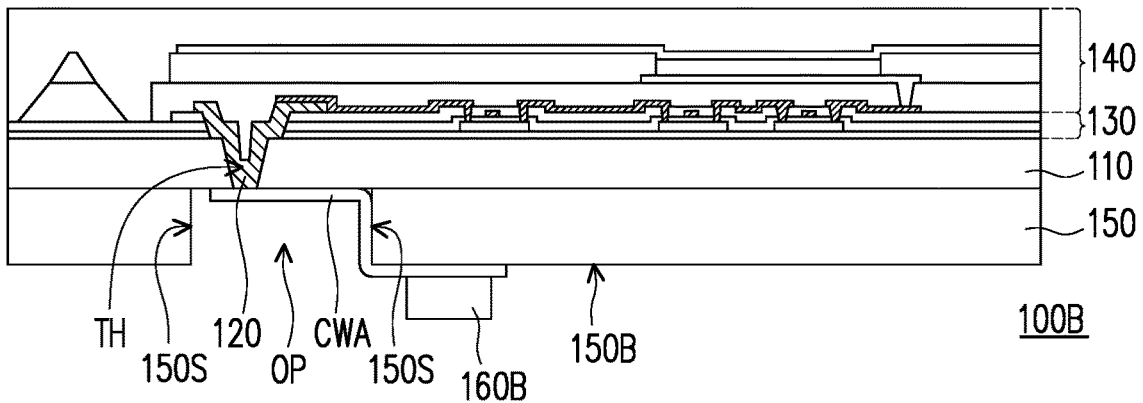
FIG. 4 is a schematic cross-sectional view of an electronic device according to yet another embodiment of the disclosure.

FIG. 4 is a schematic cross-sectional view of an electronic device according to yet another embodiment of the disclosure. As shown in FIG. 4, an electronic device 100B, similar to the electronic device 100, may be produced using the manufacturing method including the above Step S01 to the Step S09. The electronic device 100B includes the flexible substrate 110 having the through hole TH, the conductive bridge 120 disposed in the through hole TH, the circuit 130 electrically connected to the conductive bridge 120, the element layer 140 connected to the circuit 130, the supporting substrate 150 that supports the flexible substrate 110 and has the opening OP, and an electronic component 160B mounted on the supporting substrate 150 and electrically connected to the conductive bridge 120. The electronic component 160B may be a printed circuit board CWA having a packaged integrated circuit, and the electronic component 160 may be electrically connected to the conductive bridge 120 exposed by the opening OP through the printed circuit board CWA. The printed circuit board CWA extends from the conductive bridge 120 exposed by the opening OP to the bottom surface 150B of the supporting substrate 150 by continuously conforming to contours of the opening OP and the supporting substrate 150, so as to provide electrical signal transmission between the conductive bridge 120 and the electronic component 160B. In some embodiments, the printed circuit board CWA fixes the packaged integrated circuit on the printed circuit board CWA to a side surface 150S of the supporting substrate 150 from the conductive bridge 120 exposed by the opening OP by continuously conforming to the contour of the opening OP, thereby reducing the thickness of the electronic device 100.

Figure 5:
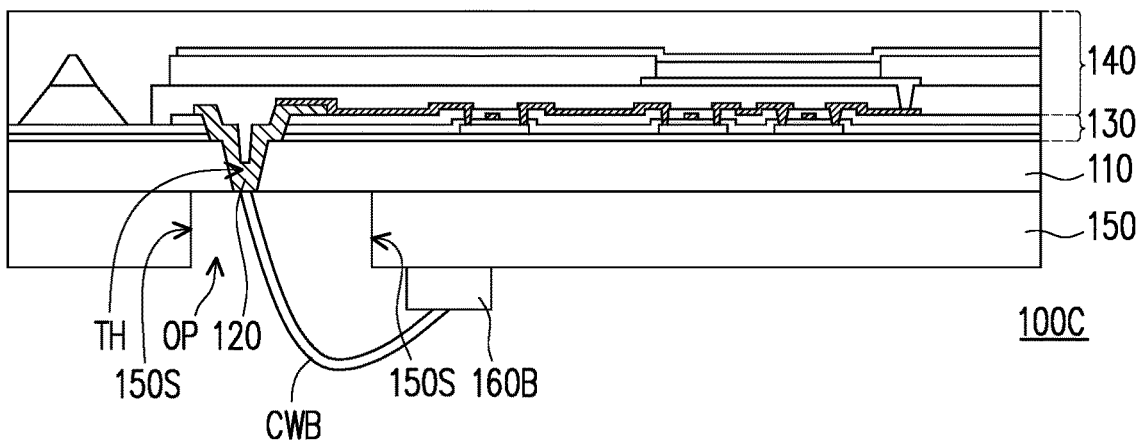
FIG. 5 is a schematic cross-sectional view of an electronic device according to still another embodiment of the disclosure.

FIG. 5 is a schematic cross-sectional view of an electronic device according to still another embodiment of the disclosure. As shown in FIG. 5, an electronic device 100C, similar to the electronic device 100, may be produced using the manufacturing method including the above Step S01 to the Step S09. The electronic device 100C includes the flexible substrate 110 having the through hole TH, the conductive bridge 120 disposed in the through hole TH, the circuit 130 electrically connected to the conductive bridge 120, the element layer 140 connected to the circuit 130, the supporting substrate 150 that supports the flexible substrate 110 and has the opening OP, and the electronic component 160B mounted on the supporting substrate 150 and electrically connected to the conductive bridge 120. The electronic component 160B may be a transmission circuit CWB including a packaged integrated circuit, and the electronic component 160B may be electrically connected to the conductive bridge 120 exposed by the opening OP through the transmission circuit CWB. A process of mounting the electronic component 160B on the supporting substrate 150 and electrically connecting to the conductive bridge 120 may first dispose the packaged integrated circuit on any of the surfaces of the supporting substrate 150, for example, the packaged integrated circuit may be disposed on the bottom surface 150B of the supporting substrate 150 or any of side surfaces 150S of the supporting substrate 150, before electrically connecting the transmission circuit CWB to the conductive bridge 120. The transmission circuit CWB may be a three-dimensional metal wire, a printed circuit board or any conductive wire. Both ends of the transmission circuit CWB are respectively connected to the conductive bridge 120 and the packaged integrated circuit to provide electrical signal transmission between the conductive bridge 120 and the packaged integrated circuit. In some embodiments, the process of mounting the electronic component 160B on the supporting substrate 150 and electrically connecting to the conductive bridge 120 may first combine the package integrated circuit and the transmission circuit CWB, before disposing the combined package integrated circuit and transmission circuit CWB on the supporting substrate 150, and then electrically connecting the transmission circuit CWB to the conductive bridge 120. The packaged integrated circuit may be disposed on the bottom surface 150B of the supporting substrate 150 or any of the side surfaces 150S of the supporting substrate 150. The transmission circuit CWB may be a three-dimensional metal wire, a printed circuit board or any conductive wire. The both ends of the transmission circuit CWB are respectively connected to the conductive bridge 120 and the package integrated circuit to provide the electrical signal transmission between the conductive bridge 120 and the package integrated circuit. In some embodiments, the transmission circuit CWB may be disposed on a side surface 150S of the supporting substrate 150 or the bottom surface 150B (not shown) of the supporting substrate 150 from the conductive bridge 120 exposed by the opening OP by continuously conforming to the contour of the opening OP, thereby reducing damage to the transmission circuit CWB due to external force.

Figure 6:
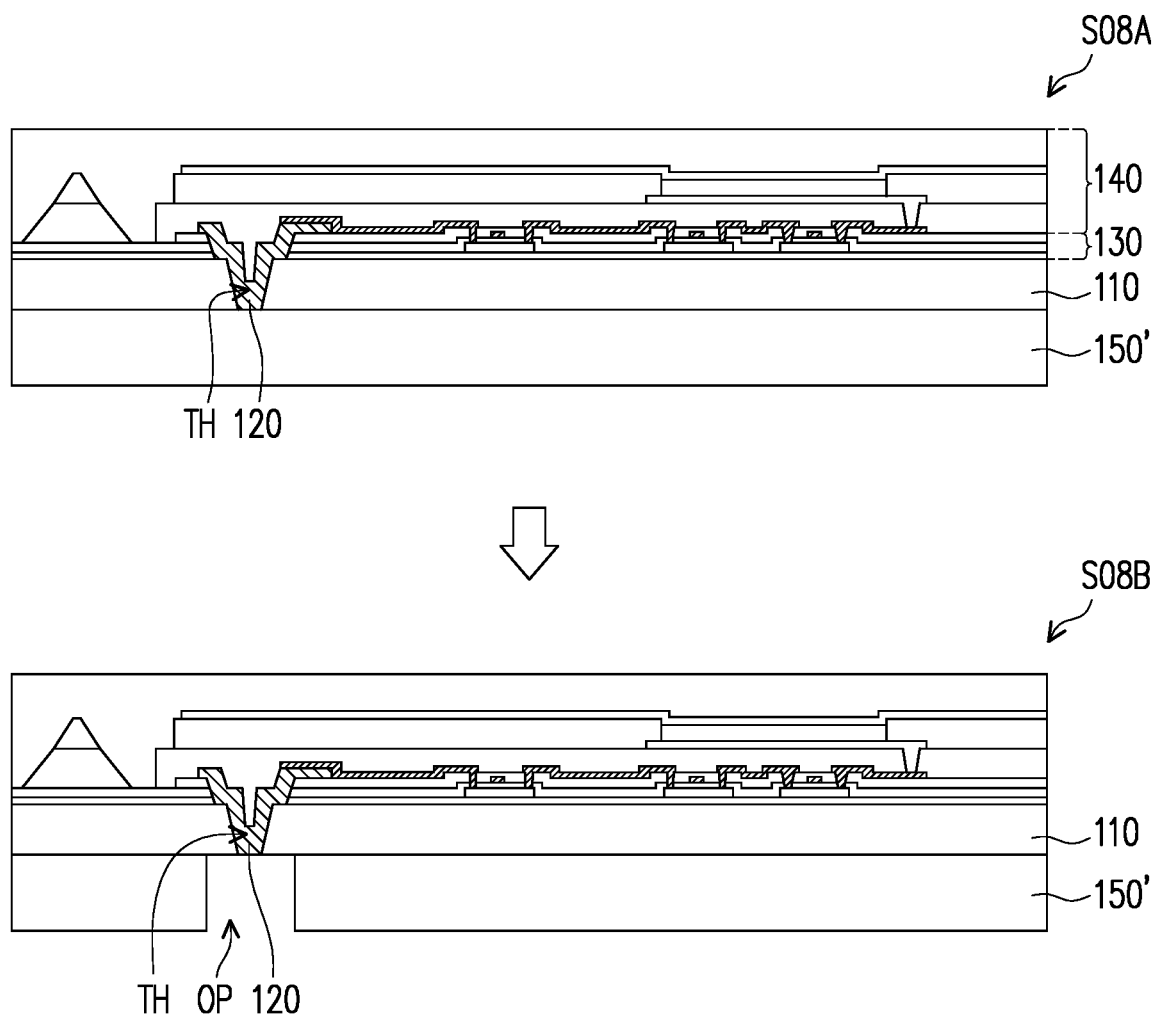
FIG. 6 is a schematic view of a step in which an opening is formed in a supporting substrate according to an embodiment of the disclosure.

FIG. 6 is a schematic view of the step in which the opening is formed in the supporting substrate according to an embodiment of the disclosure. FIG. 6 shows, for example, an implementation of the Step S08 in FIG. 2, but is not limited thereto. It can be seen from FIG. 6 that, in an embodiment, after the conductive bridge 120, the circuit 130, and the element layer 140 are produced on the flexible substrate 110, Step S08A may be performed to attach a complete, unpatterned supporting substrate 150' onto the flexible substrate 110. At this time, the conductive bridge 120 is covered by the supporting substrate 150'. Next, in Step S08B, a part of the supporting substrate 150' is removed to complete the supporting substrate 150' having the opening OP. A disposition position of the opening OP may correspond to the through hole TH, so as to expose the conductive bridge 120 in the through hole TH. In other words, the opening OP may be formed after attaching the supporting substrate 150'. However, in another embodiment, the opening OP may be formed before the supporting substrate 150' is attached. In other words, the supporting substrate 150' that already has the opening OP may be attached to the flexible substrate 110.

Figure 7:
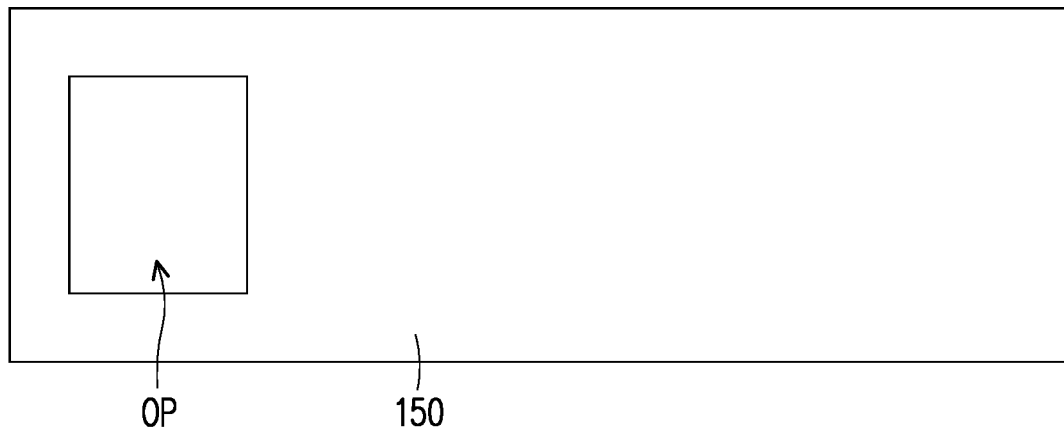
FIG. 7 represents a plan view of the supporting substrate having the formed opening.

FIG. 7 represents a plan view of the supporting substrate having the formed opening. As shown in FIG. 7, in some embodiments, the opening OP may be pre-formed on the supporting substrate 150, and then the Step S08 in FIG. 2 is performed. This is to allow the supporting substrate 150 to be attached to the flexible substrate 110 in a manner where the position of the opening OP corresponds to the conductive bridge 120 exposed by the through hole TH, and the Step S08 is completed.

Figure 8:
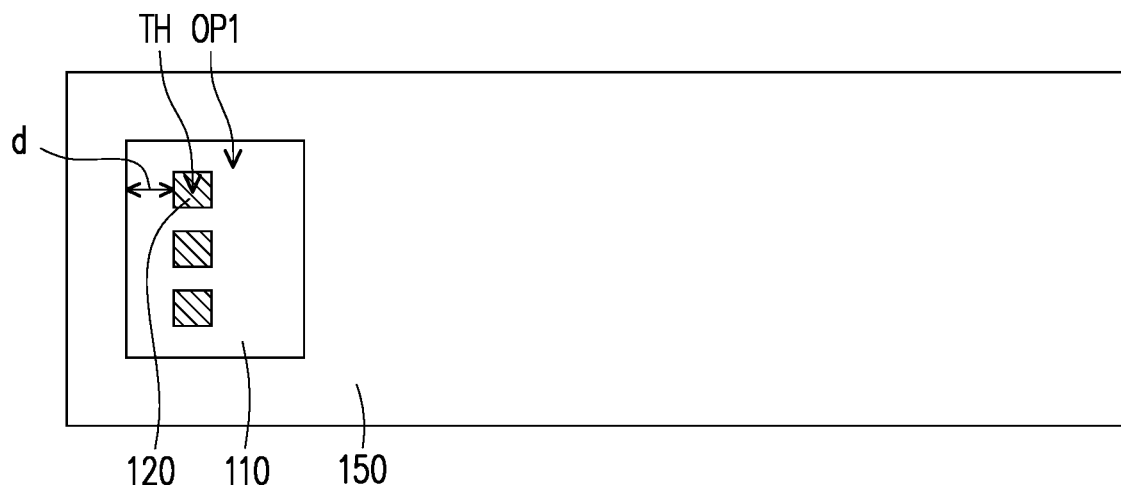
FIG. 8 is a schematic bottom view of the electronic device according to an embodiment of the disclosure after completing Step S08.

FIG. 8 is a schematic bottom view of the electronic device according to an embodiment of the disclosure after completing the Step S08. FIG. 8 mainly shows the bottom surface of the supporting substrate 150. In the embodiment, the supporting substrate 150 has an opening OP1, and the opening OP1 exposes a part of the flexible substrate 110 and also exposes the conductive bridge 120 in the through hole TH of the flexible substrate 110. It can be seen from FIG. 8 that the size of the opening OP1 may be larger than the size of an end of the through hole TH (that is, an exposed end of the through hole TH at the bottom surface of the flexible substrate 110), and multiple through holes TH may be disposed in the opening OP1. In other words, the opening OP1 may expose multiple conductive bridges 120. The different conductive bridges 120 may transmit different signals. Therefore, the conductive bridges 120 in the opening OP1 may be respectively connected to pads of the electronic component (such as the electronic component 160 shown in FIG. 2) to transmit the different signals, but the disclosure is not limited thereto. In order to expose all of the conductive bridges 120, the area of the opening OP1 may be larger than a sum of the areas of the ends of all of the through holes TH. In FIG. 8, as an example, the opening OP1 exposes three through holes TH, but is not limited thereto. In some embodiments, a minimum lateral distance d from an edge of the through hole TH to an edge of the opening OP1 may be greater than 0.1 millimeter (mm), so as to provide a suitable placement space in a subsequent step of joining to the electronic component. However, in other embodiments, the edge of the through hole TH and the edge of the opening OP1 may be partially trimmed. In addition, in some embodiments, with reference to FIGS. 2 and 8, the thickness h2 of the supporting substrate 150 may conform to the following formula: $h2 \geq ((A2/(A2-A1))^2 \times ((E1+E2)/E2)^2 \times h1$, where A1 is the area of the opening OP1, A2 is the area surrounded by an outer contour of the supporting substrate 150, E1 is the Young's modulus of the flexible substrate 110, E2 is the Young's modulus of the supporting substrate 150, and h1 is an average value of a leftmost thickness and a rightmost thickness of the flexible substrate 110 in any cross section. When the thickness h2 of the supporting substrate 150 conforms to the above formula, it can provide suitable support and ensure that the mechanical strength of the electronic device. Moreover, this formula can be applied to any implementation of a design with an opening, and the units of the h1 and h2 in the formula can be millimeters (mm).

Figure 9:
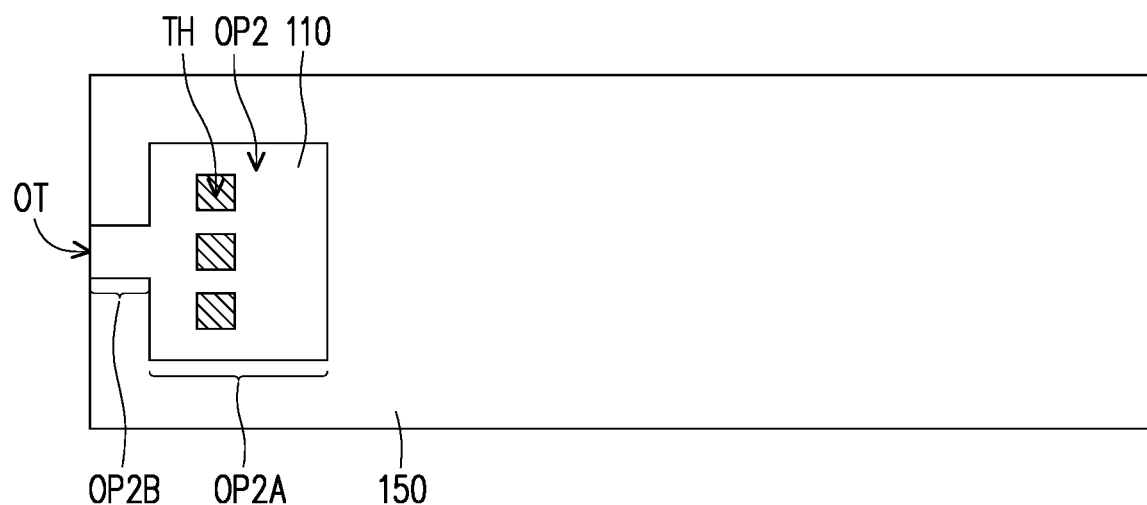
FIG. 9 is a schematic bottom view of the electronic device according to another embodiment of the disclosure after completing the Step S08.

FIG. 9 is a schematic bottom view of the electronic device according to another embodiment of the disclosure after completing the Step S08. FIG. 9 mainly shows the bottom surface of the supporting substrate 150. In the embodiment, the supporting substrate 150 has an opening OP2, and the opening OP2 exposes a part of the flexible substrate 110 and the conductive bridge 120 in the through hole TH of the flexible substrate 110. In the embodiment, the opening OP2 includes a first part OP2A corresponding to the through hole TH and a second part OP2B extending outward from the first part OP2A. The second part OP2A may have an open end OT, enabling the opening OP2 to be an open opening composed of a pattern similar to a T-shape. In other words, the opening OP2 is not closed by the supporting substrate 150.

Figure 10:
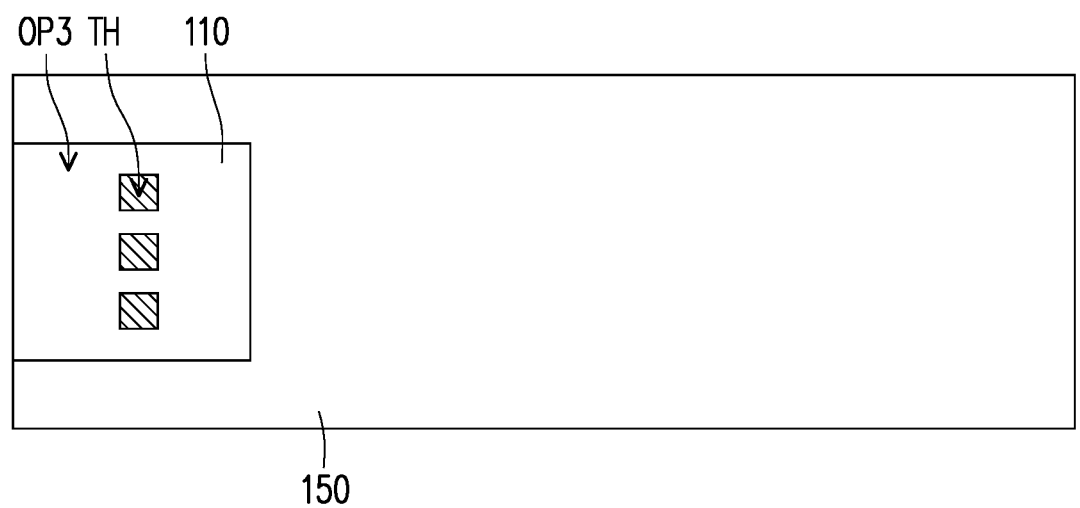
FIG. 10 is a schematic bottom view of the electronic device according to yet another embodiment of the disclosure after completing the Step S08.

FIG. 10 is a schematic bottom view of the electronic device according to yet another embodiment of the disclosure after completing the Step S08. FIG. 10 mainly shows the bottom surface of the supporting substrate 150. In the embodiment, the supporting substrate 150 has an opening OP3, and the opening OP3 exposes a part of the flexible substrate 110 and the conductive bridge 120 in the through hole TH of the flexible substrate 110. In the embodiment, the opening OP3 is an open opening, of which one side is an open end. In other words, the opening OP3 is not closed by the supporting substrate 150.

Figure 11:
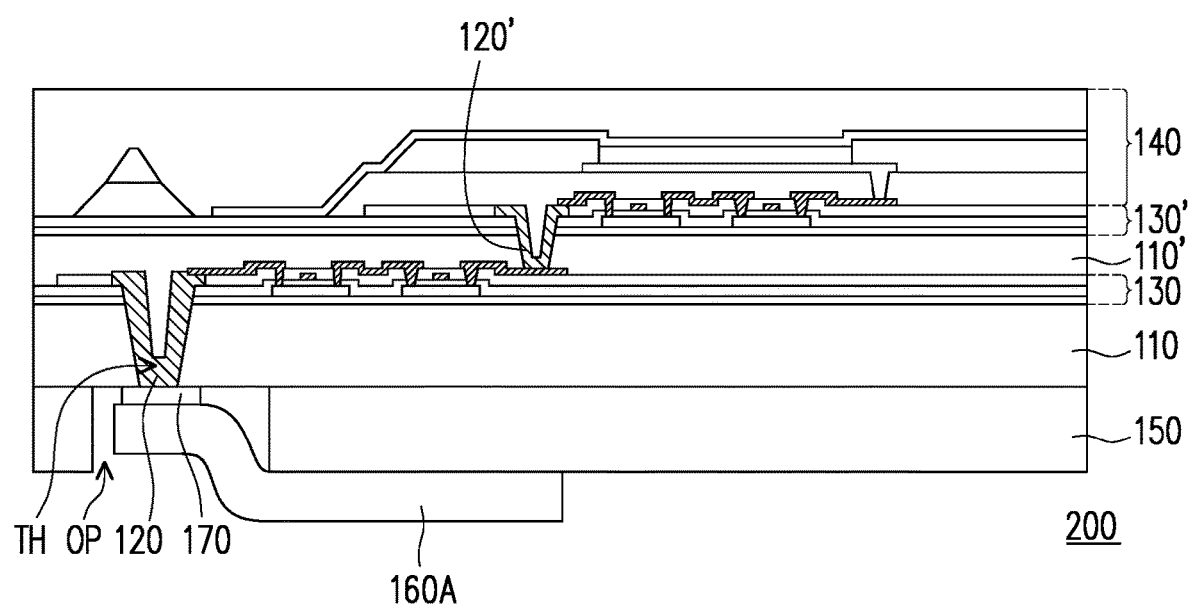
FIG. 11 is a schematic cross-sectional view of an electronic device according to another embodiment of the disclosure.

FIG. 11 is a schematic cross-sectional view of an electronic device according to another embodiment of the disclosure. As shown in FIG. 11, an electronic device 200, similar to the electronic device 100, may be produced using the manufacturing method including the above Step S01 to the Step S09. The electronic device 200 includes the flexible substrate 110 having the through hole TH, the conductive bridge 120 disposed in the through hole TH, the circuit 130 electrically connected to the conductive bridge 120, the element layer 140 connected to the circuit 130, the supporting substrate 150 that supports the flexible substrate 110 and has the opening OP, and the electronic component 160A mounted on the supporting substrate 150 and electrically connected to the conductive bridge 120. The electronic component 160A may be a flexible circuit board and the electronic component 160A may be joined to the conductive bridge 120 exposed by the opening OP through the joint 170. In addition, the electronic device 200 may also include another flexible substrate 110' having another through hole TH', another conductive bridge 120' disposed in the another through hole TH', and another circuit 130' electrically connected to the another conductive bridge 120'. Manners in which the flexible substrate 110', the conductive bridge 120' and the circuit 130' are produced are shown by the Steps S01 to S06 in FIGS. 1 and 2. Therefore, specific structures of the flexible substrate 110', the conductive bridge 120', and the circuit 130' are roughly similar to those of the flexible substrate 110, the conductive bridge 120 and the circuit 130. For example, a method for manufacturing the electronic device 200 may be to perform the Step S01 to the Step S06 again to form the flexible substrate 110', the conductive bridge 120', and the circuit 130' after the flexible substrate 110, the conductive bridge 120, and the circuit 130 are formed, and then proceeding to the Step S07 to the Step S09 to complete the electronic device 200.

Figure 12:
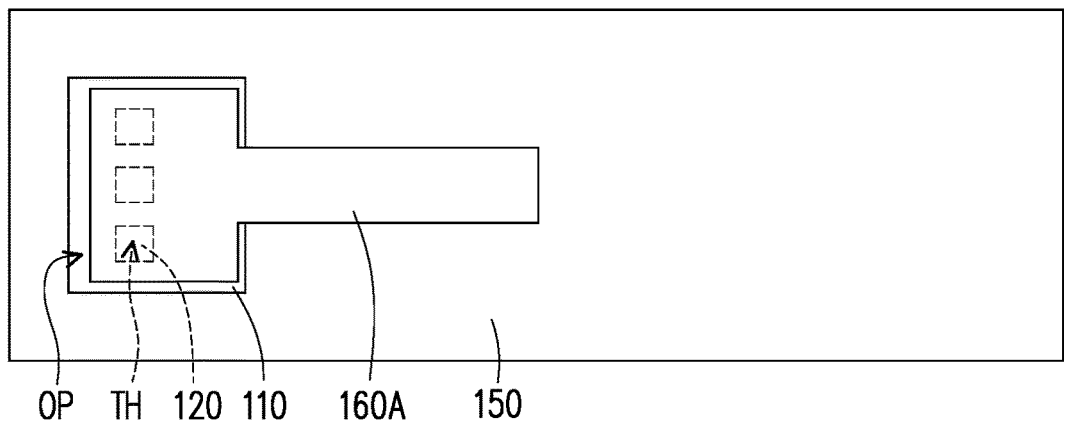
FIG. 12 is a bottom view of the electronic device in FIG. 11.

FIG. 12 is a bottom view of the electronic device of FIG. 11. It can be seen from FIG. 12 that the opening OP of the supporting substrate 150 may expose a part of the flexible substrate 110, while a part of the electronic component 160A extends into the opening OP and another part extends onto the supporting substrate 150. Specifically, the through hole TH of the flexible substrate 110 and the conductive bridge 120 in the through hole TH are covered by the electronic component in the bottom view. However, for the ease of representing the configuration relationship between the through hole TH and the conductive bridge 120, the components are represented by dotted lines. It can be seen from FIG. 12 that the opening OP may expose the multiple through holes TH. In the embodiment, the conductive bridges 120 in the different through holes TH may be configured to provide the different signal transmissions, therefore the different conductive bridges 120 may be connected to the different pads of the electronic component 160A.

Figure 13:
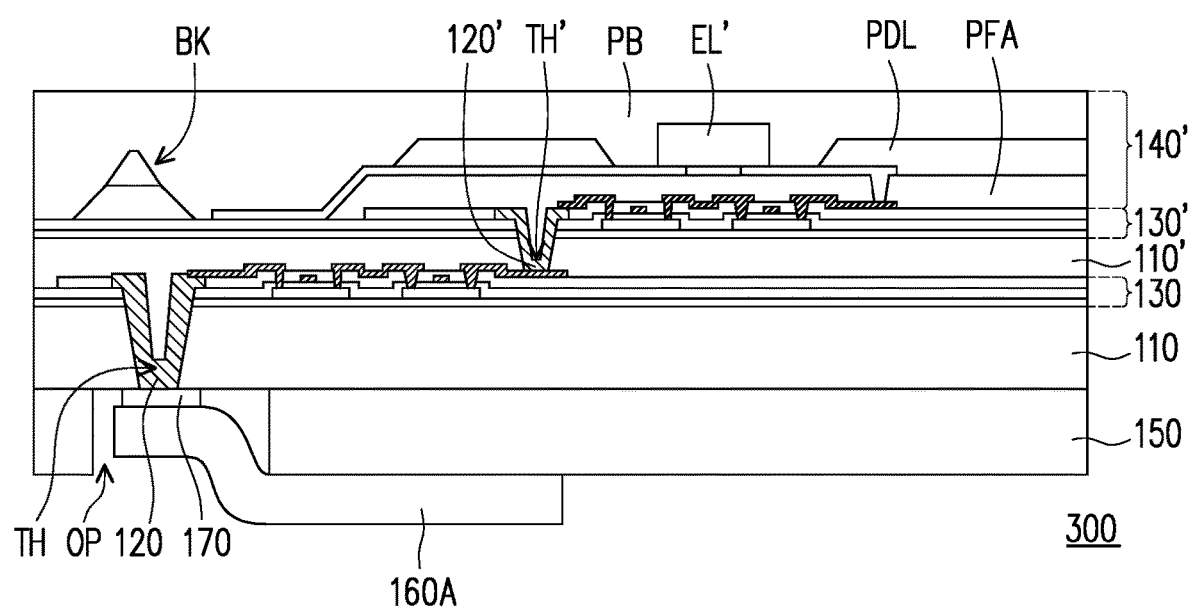
FIG. 13 is a schematic cross-sectional view of an electronic device according to yet another embodiment of the disclosure.

FIG. 13 is a schematic cross-sectional view of an electronic device according to yet another embodiment of the disclosure. As shown in FIG. 13, an electronic device 300, similar to the electronic device 200, may be produced using the manufacturing method including the above Step S01 to the Step S09. The electronic device 300 includes the flexible substrate 110 having the through hole TH, the conductive bridge 120 disposed in the through hole TH, the circuit 130 electrically connected to the conductive bridge 120, the another flexible substrate 110' having the another through hole TH', the another conductive bridge 120' disposed in the another through hole TH', the another circuit 130' electrically connected to the another conductive bridge 120', an element layer 140' electrically connected to the circuit 130 through the circuit 130', the supporting substrate 150 that supports the flexible substrate 110 and has the opening OP, and the electronic component 160A mounted on the supporting substrate 150 and electrically connected to the conductive bridge 120. The electronic component 160A may be a printed circuit board and the electronic component 160A may be joined to the conductive bridge 120 exposed by the opening OP through the joint 170. In addition, the element layer 140' of the electronic device 300 may include the flat layer PFA, the pixel definition layer PDL, a light-emitting element EL', the block wall structure BK, and the packaging layer PB. Reference may be made to the related descriptions in the foregoing embodiments, such as FIG. 2, for the flat layer PFA, the pixel definition layer PDL, the block wall structure BK and the packaging layer PB, while the light-emitting element EL' is, for example, a pre-produced light-emitting diode (LED) unit. In some embodiments, the light-emitting element EL' may be a mini LED, a micro LED, but is not limited thereto. Specifically, the flat layer PFA covers the circuit 130' and reduces the unevenness due to a concave-convex structure of the circuit 130'. The pixel definition layer PDL is disposed on the flat layer PFA and has an accommodating opening to expose some conductive circuits in the circuit 130'. The light-emitting element EL' is disposed in the accommodating opening of the pixel definition layer PDL and is electrically connected to the exposed conductive circuits in the circuit 130'. The light-emitting element EL' may be electrically connected to the circuit 130' in a flip-chip bonding manner, but is not limited thereto. In some embodiments, the light-emitting element EL' may be electrically connected to the circuit 130' by manners such as surface bonding, or wire bonding. As in the foregoing embodiments, the electronic device 300 of the embodiment may electrically connect the components on the two opposite surfaces of the flexible substrate 110 to each other through the disposition of the through holes TH and TH', and the conductive bridges 120 and 120', which facilitates the reduction of the space required by the circuit layout, such as the thickness. Therefore, the electronic device 300 can have a more compact and thinner volume. In summary, the method for manufacturing the electronic device according to the embodiments of the disclosure includes forming the through hole on the flexible substrate, forming the conductive bridge in the through hole, and forming the opening corresponding to the through hole on the supporting substrate. The conductive bridge in the through hole provides an electrical transmission path in the electronic device, allowing the electrical signal to be transmitted from the top surface of the flexible substrate to the bottom surface or from the bottom surface to the top surface. Therefore, the electronic device can realize mutual transmission of the electrical signal between the two surfaces without increasing the thickness of the device, thereby realizing a thinner electronic device.

Finally, it should be noted that the foregoing embodiments are only used to illustrate the technical solutions of the disclosure, and not intended to limit the disclosure. Although the disclosure has been described in detail with reference to the foregoing embodiments, persons skilled in the art should understand that modifications to the technical solutions described in the foregoing embodiments or equivalent replacements may be made to some or all of the technical features. However, the modifications or replacements do not cause the essence of the corresponding technical solutions to depart from the scope of the technical solutions according to the embodiments of the disclosure.

What is claimed is:

1. An electronic device, comprising:
    a first substrate having a hole;
    a circuit disposed on the first substrate;
    a conductive element disposed in the hole of the first substrate;
    a second substrate corresponded to the first substrate, wherein the second substrate has an opening which penetrates the second substrate and corresponds to the conductive element; and
    an electronic component corresponded to the second substrate, wherein the electronic component is electrically connected to the circuit and the conductive element.

2. The electronic device according to claim 1, wherein the first substrate has a multi-layered structure.

3. The electronic device according to claim 1, wherein the electronic component is a packaged integrated circuit.

4. The electronic device according to claim 1, wherein the electronic component is electrically connected to the conductive element through a joint.

5. The electronic device according to claim 1, wherein the second substrate is located between first substrate and the electronic component in a normal direction of the first substrate.

6. The electronic device according to claim 1, wherein a material of the second substrate comprises glass.

* * * * *